United States Patent [19]

Asakura et al.

[11] Patent Number: 4,962,446

[45] Date of Patent: Oct. 9, 1990

[54] ELECTRODE TERMINAL FOR CAPACITOR

[75] Inventors: Tadao Asakura, Kawaguchi; Shizuo Nishikawa, Tokyo, both of Japan

[73] Assignee: New Central Corporation, Tokyo, Japan

[21] Appl. No.: 193,112

[22] Filed: May 11, 1988

[30] Foreign Application Priority Data

May 11, 1987 [JP] Japan ................................. 62-68873
Apr. 6, 1988 [JP] Japan ................................. 63-45651

[51] Int. Cl.⁵ .............................................. H05K 7/02
[52] U.S. Cl. .................................... 361/400; 228/138;
361/303; 361/307; 361/405; 361/417
[58] Field of Search ..................... 228/135, 138, 139;
361/278, 301, 303–310, 379, 383, 394, 400,
402–406, 408, 417, 419–420

[56] References Cited

U.S. PATENT DOCUMENTS 3,015,050 12/1961 Deyerl ................................. 361/308

Primary Examiner—Gregory D. Thompson
Attorney, Agent, or Firm—Price, Gess & Ubell

[57] ABSTRACT

An electrode terminal for an electrolytic capacitor capable of eliminating arrangement and welding of a lead wire to accomplish satisfactory quality control and improve productivity. The capacitor is adapted to be used for a capacitor including a capacitor element. The terminal includes a terminal body consisting of a flat section connected to the capacitor element of the capacitor and a cylindrical section serving as an electrode lead and a contact element made of a material exhibiting good solderability and securely mounted on an outer end of the cylindrical section in a leadless manner. The cylindrical section may be formed with a ring-like flange at a portion thereof contiguous to a sealing member of the capacitor. The contact element may be formed on a bottom thereof with an air vent hole.

18 Claims, 5 Drawing Sheets

FIG.13A   FIG.13B   FIG.13C
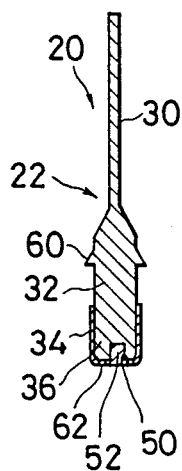 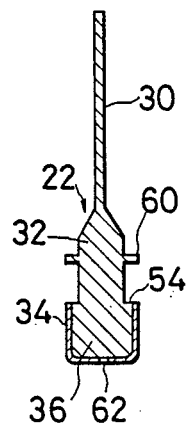 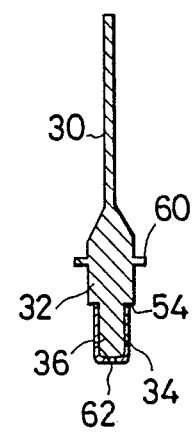
FIG.13D   FIG.13E   FIG.13F
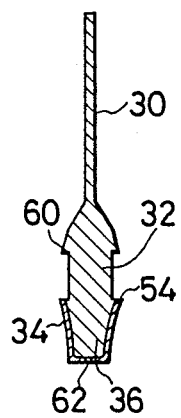 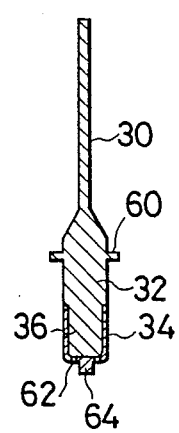 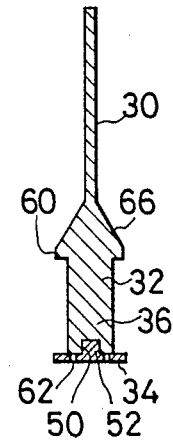

ELECTRODE TERMINAL FOR CAPACITOR

BACKGROUND OF THE INVENTION

1. Field of the Invention

This invention relates to an electrode terminal for a capacitor, and more particularly to an electrode terminal which is suitable for use for a capacitor such as an electrolytic capacitor, a paper condenser or the like and adapted to serve also as an electrode lead.

2. Description of the Prior Art

An electrode terminal which has been conventionally used for a capacitor such as an electrolytic capacitor includes an aluminum tab and a lead wire led out from the tab. An electrolytic capacitor in which the so-constructed electrode terminal is incorporated is generally constructed in such a manner as shown in FIG. 1. More particularly, a capacitor includes a capacitor element 100 sealedly received in a casing 102 by means of a sealing member 104 and electrode terminals 106. Each of the electrode terminals 106 includes a tab section 108 inserted through the sealing member 104 to the casing 102 for connection to the capacitor element 100 and a lead wire 110 led out from the tab section 108 through a welding portion 112 to an exterior of the casing 102. The lead wire 110 is then attached to a substrate 114 by soldering.

As described above, in the conventional electrode terminal, the aluminum tab and lead wire are joined together by welding. Accordingly, the conventional electrode terminal often causes a failure in welding depending on configurations and/or dimensions of the tab and lead wire, resulting in deterioration of its quality. Also, burrs often occur on the lead wire to cause the electrode terminal to be below standards. Also, the conventional electrode terminal has another disadvantage that any impurity produced during the welding operation adheres to the aluminum tab to highly deteriorate characteristics of a capacitor. Further, a shortage of strength occurs at the welding portion which may lead to disconnection of the lead wire or a contact failure, resulting in requiring destructive inspection of a capacitor. In addition, it is required to make the lead wire of a weldable material. Furthermore, the conventional electrode terminal fails to cause a capacitor to exhibit satisfactory sealing characteristics.

Thus, it will be noted that the conventional electrode terminal fails in satisfactory quality control and an improvement in productivity.

Accordingly, it would be highly desirable to develop an electrode terminal which is capable of eliminating welding of a lead wire to allow satisfactory quality control and increase productivity.

SUMMARY OF THE INVENTION

Generally speaking, in accordance with the present invention, an electrode terminal for a capacitor including a capacitor element is provided. The electrode terminal includes a terminal body connected to the capacitor element of the capacitor and a contact element securely mounted on an outer end of the terminal body in a leadless manner, that is, without a conventional lead wire. The contact element is made of a material exhibiting good soldering characteristics.

Also, in accordance with the present invention, an electrode terminal for a capacitor including a capacitor element and a sealing member by which the capacitor element is sealedly received in the capacitor is provided. The electrode terminal includes a terminal body connected to the capacitor element of the capacitor and led out from the capacitor through the sealing member and a contact element securely mounted on an outer end of the terminal body in a leadless manner. The terminal body is formed with a ring-like like flange at a portion thereof contiguous to the sealing member. The contact element is made of a material exhibiting good soldering characteristics. The contact element may be provided at a bottom thereof with an air vent hole.

Accordingly, it is an object of the present invention to provide an electrode terminal for a capacitor which is capable, of permitting satisfactory quality control and improving the productivity to be accomplished.

It is another object of the present invention to provide an electrode terminal for a capacitor which is capable of being highly simplified in structure and mass-produced.

It is a further object of the present invention to provide an electrode terminal for a capacitor which is capable of eliminating the arrangement and welding of a lead wire.

It is still another object of the present invention to provide an electrode terminal for a capacitor which is capable of exhibiting high rigidity and strength.

It is yet another object of the present invention to provide an electrode terminal for a capacitor which is capable of causing the capacitor to exhibit excellent sealing characteristics.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings; wherein:

FIGS. 13A to 13F each are a vertical sectional view showing another modification of the embodiment of FIG. 8.

DETAILED DESCRIPTION OF THE PREFERRED EMBODIMENTS

Figure 1:
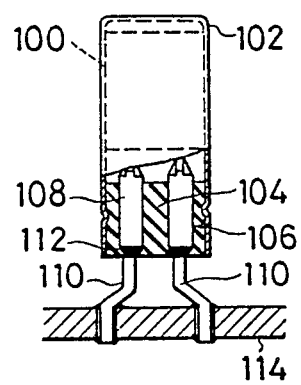
FIG. 1 is a front elevation view partly in section showing a capacitor in which a conventional electrode terminal is mounted.

Now, an electrode terminal for a capacitor according to the present invention will be described with reference to FIGS. 2 to 13F, wherein like reference numerals designate like or corresponding parts throughout.

Figure 2:
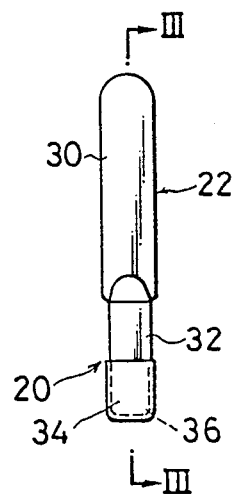
FIG. 2 is a front elevation view showing an embodiment of an electrode terminal for a capacitor according to the present invention.
Figure 3:
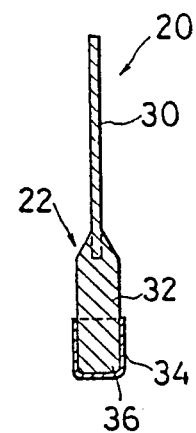
FIG. 3 is a vertical sectional view taken along line III—III of FIG. 2.
Figure 4:
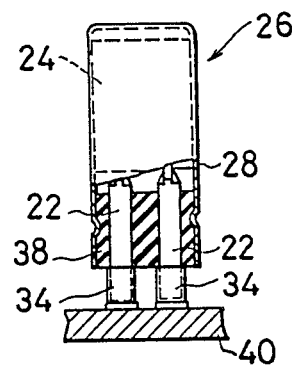
FIG. 4 is a front elevation view partly in section showing a capacitor in which an electrode terminal shown in FIG. 2 is mounted.

FIGS. 2 and 3 illustrate an embodiment of an electrode terminal according to the present invention. An electrode terminal of the illustrated embodiment generally designated at reference numeral 20 in FIGS. 2 and 3 includes a terminal body 22 which may be formed of a rod of a metal material such as aluminum or the like by rolling. The terminal body 22 is adapted to be connected at one end thereof to a capacitor element 24 of a capacitor 26 and outwardly led out at the other end from a casing 28 of the capacitor 26 as shown in FIG. 4. For this purpose, in the illustrated embodiment, the terminal body 22 is formed of aluminum into a tab which includes a flat section 30 received in the casing 28 and connected at an upper end thereof to the capacitor element 24 and a cylindrical section 32 integrally joined to the flat section 30. The cylindrical section 32 is led out from the casing 28 and serves as an electrode lead. Thus, in the illustrated embodiment, two such electrode terminals 20 constitute a capacitor together with the capacitor element 24.

The electrode terminal 20 of the illustrated embodiment further includes a contact element 34 fixedly mounted on the other end or outer end 36 of the terminal body 22 in a leadless manner. The contact element 34 serves to fixedly mount the capacitor 26 therethrough with respect to, for example, a substrate such as a printed circuit board by soldering. For this purpose, the contact element 34 is made of a material which exhibits good solderability or soldering characteristics. In the embodiment, the contact element 34 is arranged on an outer end of the cylindrical section 32.

In the illustrated embodiment, the contact element 34, as shown in FIGS. 2 and 3, is formed into a shape like a bottom-closed cylinder so that it may be fittedly mounted on the outer end 36 of the terminal body 22. The contact element 34 is preferably firmly fixed on the outer end 36 of the terminal body 22. For this purpose, suitable means such as welding, press fitting, caulking, pressing or the like may be conveniently employed.

The capacitor element 24 to which the electrode terminal 20 of the illustrated embodiment is connected may be used for an electrolytic capacitor. For this purpose, it may be constructed into a sandwich structure of a desired capacity, for example, by fixedly interposing a spacer or separator between an anode foil and a cathode foil. The capacitor 26 shown in FIG. 4 may be assembled by fittedly receiving the so-constructed capacitor element 24 in the casing 28, sealedly closing an opening of the casing 28 with a sealing material 38 made of an elastic material such as rubber, and leading out the electrode terminals 20 acting as an anode and a cathode of the capacitor through the sealing member 38 from the casing 28. In the illustrated embodiment, the cylindrical section 32 of the terminal body 22 is led out through the sealing member 38. The contact element 34 of each of the electrode terminals 20 is then mounted on a substrate 40 such as, for example, a printed circuit board.

As described above, the electrode terminal 20 of the illustrated embodiment is so constructed that the contact element 34 made of a material exhibiting good solderability or soldering characteristics is fixedly mounted on the outer end 36 of the terminal body 22 in a leadless manner. Such construction effectively eliminates an arrangement of any lead wires in a capacitor and welding operation. This results in preventing any deterioration of the quality of a capacitor due to a failure in welding the contamination of the electrode terminal with any impurity produced during welding and any disconnection due to welding. Also, this leads to miniaturization of a capacitor to a degree sufficient to provide a chip-type capacitor.

Also, the construction of the illustrated embodiment prevents a material for a portion of the electrode led out from being limited to any specific kind, to thereby accomplish a variation in characteristics of a capacitor as desired. Further, it eliminates boring of a substrate on which a capacitor is to be mounted and permits both surfaces of a substrate to be effectively utilized. In addition, it eliminates a necessity of subjecting electrode lead wires to forming and a limitation of dimensions and a configuration of a portion of a substrate on which a capacitor is to be mounted by soldering.

Thus, it will be noted that the electrode terminal of the embodiment causes a capacitor of excellent quality to be readily manufactured at a low cost and also miniaturization of a capacitor. Also, the electrode terminal provides a capacitor suitable for mass production.

Figure 5:
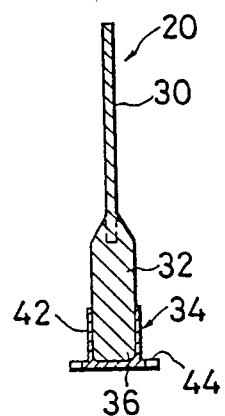
FIG. 5 is a vertical sectional view showing a modification of the electrode terminal shown in FIG. 2.
Figure 6:
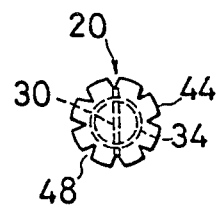
FIG. 6 is a bottom view of the electrode terminal shown in FIG. 5.
Figure 7A:
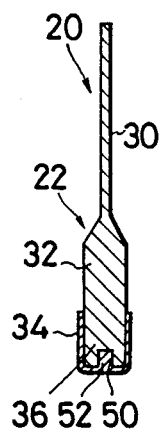
FIGS. 7A to 7F each are a vertical sectional view showing another modification of the embodiment of FIG. 2.
Figure 7B:
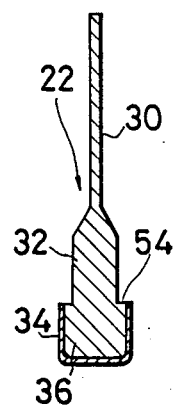
Figure 7C:
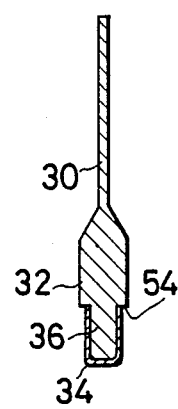
Figure 7D:
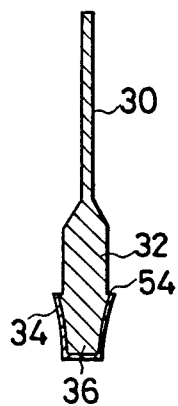
Figure 7E:
Figure 7F:
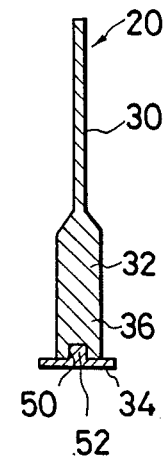

The electrode terminal of the embodiment may be modified as shown in FIGS. 5 and 6. In an electrode terminal 20 shown in FIGS. 5 and 6, a contact element 34 comprises a bottom-closed cylinder body 42 and a flange 44 provided at a periphery of a proximal end of the cylinder body 42 or a bottom of the body 42. The flange 44 may be formed with a plurality of radially extending cutouts 48 for ensuring satisfactory soldering. The remainder of the electrode terminal 20 may be constructed in substantially the same manner as that of FIGS. 2 and 3.

Alternatively, the electrode terminal 20 of the embodiment may may be modified in such a manner as shown in each of FIGS. 7A to 7F. In an electrode terminal shown in FIG. 7A, an outer end 36 of a terminal body 22 is formed with a recess 50 and correspondingly a contact element 34 is provided on an inner surface of a bottom thereof with a projection 52 fitted in the recess 50 of the terminal body 22, so that a contact area between the contact element 34 and the terminal body 22 may be increased to more firmly mount the contact element 34 on the terminal body 22. An electrode terminal 20 shown in each of FIGS. 7B to 7E is so constructed that an outer end, 36 of a terminal body 22 is formed into a cross-sectional area different from that of the remainder of the body 22 for the purpose of preventing leakage of a liquid in the capacitor and permitting the sealing member 38 of the capacitor 26 to exhibit better sealing function. In the modification shown in each of FIGS. 7B to 7E, the outer end 36 of the terminal body 22 is connected to the remainder of the body 22 through a discontinuity or step portion 54. Also, in the electrode terminal 20 of FIG. 7D, the outer end 36 is tapered off or formed into a substantially inverted frustconical shape and a contact element 34 is formed into a shape corresponding thereto and securely fitted thereon. In an electrode terminal 20 shown in FIG. 7F, a contact element 34 is formed into a plate-like shape and is provided thereon with a projection 52 and an outer end 36 of a terminal body 22 is formed with a recess 50 in which the projection 52 is securely fitted.

It will be readily understood that each of the modifications shown in FIGS. 5 to 7F exhibits substantially the same advantages as those of the embodiment shown in FIGS. 2 and 3.

In the embodiment described above, the terminal body may be formed into any suitable shape in cross section such as a circular shape, a triangular shape, a semi-circular shape or the like and suitable dimensions depending on the capacitor element.

Figure 8:
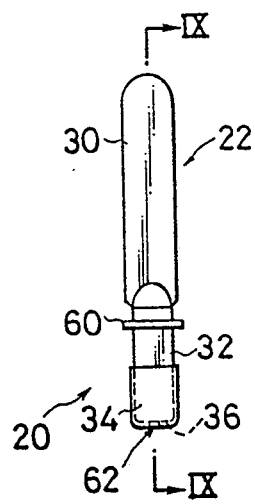
FIG. 8 is a front elevation view showing another embodiment of an electrode terminal for a capacitor according to the present invention.
Figure 9:
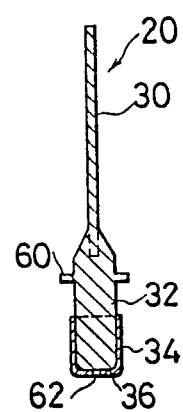
FIG. 9 is a vertical sectional view taken along line IX—IX of FIG. 8.
Figure 10:
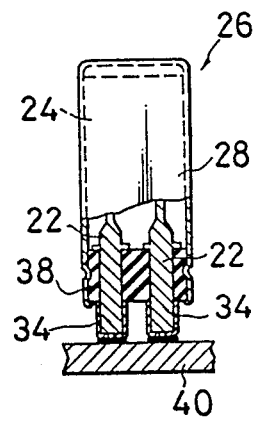
FIG. 10 is a front elevation view partly in section showing a manner of mounting of an electrode terminal shown in FIG. 8 in a capacitor.

FIGS. 8 and 9 show another embodiment of an electrode terminal for a capacitor according to the present invention. In an electrode terminal 20 of the embodiment, a cylindrical section 32 of a terminal body 22 is formed with a ring-like flange 60 at a portion thereof contiguous to a sealing member 38 and more specifically to an inner or outer surface of the sealing member 38 when it is incorporated into a capacitor, so that it may be intimately contacted with the inner or outer surface of the sealing member 38 to close any possible gap between a through-hole of the sealing member 38 via which the electrode terminal 20 is inserted into a casing 28 and the cylindrical, section 32 of the terminal 22, to thereby sealingly isolate an interior of the casing from its exterior. In the embodiment, the ring-like flange 60 is formed at a portion of the cylindrical section 32 contiguous to the inner surface of the sealing member 38 positioned in the casing 28, so that it may sealingly close any possible gap between the throughhole of the sealing member 38 and the cylindrical section 32 on a side of the inner surface of the sealing member 38 as shown in FIG. 10. However, it may be formed at a portion of the section 32 contiguous to the outer surface of the member 38. In the latter case, the flange 60 may be formed at a portion of the cylindrical section 32 positioned between the sealing member 38 and a contact element 34 when the electrode terminal 20 is fittedly inserted through the sealing member 38.

In the electrode terminal 20 of the illustrated embodiment, the contact element 34 may be formed at a bottom thereof with an air vent hole 62 which acts to permit the escape of air in the contact element 34 therethrough to an exterior of the element 34 when the element 34 is pressedly fitted on an outer end 36 of the cylindrical element 32, to thereby ensure smooth fitting between both elements.

The remaining portion of the embodiment of FIGS. 8 and 9 may be substantially the same in construction as that of FIGS. 2 and 3. Accordingly, the embodiment exhibits substantially the same advantages as that shown in FIGS. 2 and 3, in addition to its own advantages described above.

Figure 11:
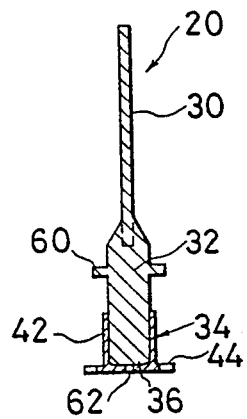
FIG. 11 is a vertical sectional view showing a modification of the electrode terminal shown in FIG. 8.
Figure 12:
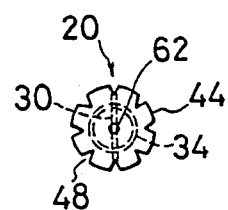
FIG. 12 is a bottom view of an electrode terminal shown in FIG. 11.

FIGS. 11 and 12 show a modification of the embodiment of FIGS. 8 and 9. In an electrode terminal 20 of FIGS. 11 and 12, a contact element 34 comprises a bottom-closed cylinder body 42 and a flange 44 provided at a periphery of a bottom of the cylinder body 42, as in the above-described electrode terminal shown in FIGS. 6 and 7. The flange 44 may be formed with a plurality of radially extending cutouts 48 for ensuring satisfactory soldering. The remaining of the electrode terminal may be constructed in substantially the same manner as that of FIGS. 8 and 9.

Alternatively, the electrode terminal of FIGS. 8 and 9 may be modified in such a manner as shown in each of FIGS. 13A to 13F. In the electrode terminal 20 of FIG. 13A, an outer end 36 of a terminal body 22 is formed with a recess 50 and correspondingly a contact element 34 is provided on an inner surface of a bottom thereof with a projection 52 fitted in the recess 50 of the terminal body 22, so that a contact area between the contact element 34 and the terminal body 22 may be increased to more firmly mount the contact element 34 on the terminal body 22, as in the electrode terminal of FIG. 7A described above. An electrode terminal 20 shown in each of FIGS. 13B to 13E is constructed in such a manner that an outer end 36 of a terminal body 22 is formed into a cross-sectional area different from that of the remainder of the body 22. Such construction not only effectively prevents leakage of a liquid in a capacitor but causes the sealing member of the capacitor to exhibit a much better sealing function in cooperation with a ring-like flange 60. In the modification shown in each of FIGS. 13B to 13E, the outer end 36 of the terminal body 22 is connected to the remainder of the body 22 through a discontinuity or step 54. Also, in the electrode terminal 20 of FIG. 13D, the outer end 36 is formed into a substantially inverted frust-conical shape and a contact element 34 is formed into a shape corresponding thereto and fixedly fitted thereon. Further, in FIG. 13E, a contact element 34 of a bottom-closed cylindrical shape is formed on an outer surface of a bottom 62 thereof with a projection 64.

An electrode terminal 20 shown in FIG. 13F is so constructed that a ring-like flange 60 is formed at a proximal end of a tapered section 66 through which a cylindrical section 32 is connected to a flat section 30 in such a manner it is contiguous to the tapered section. Also, in the modification of FIG. 13F, a contact element 34 is formed into a plate-like shape and provided thereon with a projection 52 and an outer end 36 of a terminal body 22 is formed with a recess 50 in which the projection 52 is securely fitted.

It will be readily understood that each of the modifications shown in FIGS. 11 to 13F exhibits substantially the same advantages as those of the embodiment shown in FIG. 8 and 9.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all the generic and specific features of the invention herein described and all statements of the scope of the invention which, as a matter of language, might be said to fall therebetween.

What is claimed is:

1. An electrode terminal for a capacitor assembly having a capacitor element and a sealing member by which the capacitor element is sealingly received in the capacitor assembly so that the electrode terminal is available for connection to a conductive substrate, comprising:

a terminal body connected to the capacitor element of the capacitor assembly and extending through the sealing member, said terminal body being formed with a ring-like flange at a portion thereof contiguous to the sealing member; and a contact element having an air vent hole securely mounted on an outer bottom end of said terminal body, the contact element connecting the electrode terminal directly to the conductive substrate, said contact element is made of a material exhibiting good soldering characteristics.

2. An electrode terminal as defined in claim 1, wherein said terminal body comprises a flat section connected to the capacitor element of the capacitor and a solid cylindrical section serving as an electrode lead; said contact element being mounted on said outer end of said cylindrical section.

3. An electrode terminal as defined in claim 2, wherein said terminal body is formed of aluminum into a tab-like shape.

4. An electrode terminal as defined in claim 1, wherein said outer end of said terminal body is formed into a cross-sectional area different from that of any remaining cross-sectional areas of said terminal body.

5. An electrode terminal as defined in claim 1, wherein said contact element is formed into a plate-like shape.

6. An electrode terminal as defined in claim 1, wherein said terminal body includes a cylindrical section serving as an electrode lead and passed through the sealing member;

said contact element being mounted on said outer end of said cylindrical section.

7. An electrode terminal as defined in claim 6, wherein said ring-like flange is formed at said cylindrical section.

8. An electrode terminal as defined in claim 6, wherein said terminal body further includes a flat section formed integral with said cylindrical section and connected to the capacitor element.

9. An electrode terminal as defined in claim 8, wherein said cylindrical section is connected to said flat section through a tapered section interposed therebetween;

said ring-like flange being positioned at a proximal end of said tapered section.

10. An electrode terminal as defined in claim 9, wherein said terminal body is formed of aluminum into a tab-like shape.

11. An electrode terminal for use on a capacitor having a capacitor element and a housing member enclosing the capacitor element, comprising:

a terminal body connected to the capacitor element of the capacitor and extending from the housing member, and a contact element securely mounted on an outer end of said terminal body and extending across the outer end, said contact element being made of a material exhibiting good soldering characteristics, the contact element serving to connect the electrode terminal directly to a conductive substrate, the contact element comprises a bottom-closed cylinder having a flange formed at a proximal end of the contact element.

12. An electrode terminal as defined in claim 11, wherein said contact element is fixed on said outer end of said terminal body by any one of welding, press fitting and caulking.

13. An electrode terminal as defined in claim 11, wherein said contact element is formed on a bottom thereof with an air vent hole.

14. In a capacitor having a capacitor element for holding an electrical charge in a sealed housing member, the improvement comprising:

a pair of electrode terminals having an upper elongated flat section for connection to the capacitor element within the housing member, each flat section being integrally connected to a lower solid cylindrical section extending through the sealed housing member to the exterior, each cylindrical section having a lower contact element of a material exhibiting a soldering capability to a circuit board, the lower contact elements extend across the lower surface of each cylindrical section and around the side of each cylindrical section to form a permanent connection with each cylindrical section, the cylindrical sections have a recess on their lower surfaces and the contact elements have a projection positioned and configured to extend within and to be complementary to the recess.

15. The capacitor of claim 14 wherein a lower side of each cylindrical section adjacent its lower surface is recessed from an upper side and each contact element has a corresponding and complementary side configuration to be positioned within each side recess and provide an approximately same exterior dimension to that of each upper cylindrical section.

16. An electrode terminal for a capacitor assembly having a capacitor element and sealing member by which the capacitor element is sealedly received in the capacitor assembly, comprising:

a terminal body connected to the capacitor element of the capacitor assembly and extending through the sealing member, said terminal body being formed with a ring-like flange at a portion thereof contiguous to the sealing member, and a contact element securely mounted on an outer end of said terminal body to replace the use of a lead wire, said contact element being made of a material exhibiting good soldering characteristics and formed on a bottom thereof with an air vent hole.

17. An electrode terminal for use on a capacitor having a capacitor element and a housing member enclosing the capacitor element, comprising:

a terminal body connected to the capacitor element of the capacitor and extending from the housing member, and a contact element securely mounted on an outer end of said terminal body and extending across the outer end, said contact element being made of a material exhibiting good soldering characteristics, said contact element serving to connect the electrode terminal directly to a conductive substrate, wherein said outer end of said terminal body is formed into a substantially inverted frustrum-conical shape and said contact element is formed into a shape corresponding to that of said outer end of said terminal body.

18. An electrode terminal for a capacitor assembly having a capacitor element and a sealing member by which the capacitor element is sealingly received in the capacitor assembly so that the electrode terminal is available for connection to a conductive substrate, comprising:

a terminal body connected to the capacitor element of the capacitor assembly and having a cylindrical section, with a ring-like flange, serving as an electrode lead and extending through the sealing member, said terminal body further including a flat section formed integral with said cylindrical section through a tapered section between the flat and cylindrical sections, the ring-like flange being positioned at a proximal end of said tapered section contiguous to the sealing member, and a contact element securely mounted on an outer end of said terminal body, the contact element connecting the electrode terminal directly to the conductive substrate, said contact element being made from a material exhibiting good soldering characteristics.

* * * * *